United States Patent
Lim et al.

(10) Patent No.: US 9,754,899 B2
(45) Date of Patent: Sep. 5, 2017

(54) SEMICONDUCTOR STRUCTURE AND METHOD OF FABRICATING THE SAME

(71) Applicant: Advanpack Solutions PTE LTD, Singapore (SG)

(72) Inventors: Shoa Siong Raymond Lim, Singapore (SG); Hwee Seng Jimmy Chew, Singapore (SG)

(73) Assignee: Advanpack Solutions PTE LTD, Singapore (SG)

( * ) Notice: Subject to any disclaimer, the term of this patent is extended or adjusted under 35 U.S.C. 154(b) by 0 days.

(21) Appl. No.: 14/769,599

(22) PCT Filed: Feb. 21, 2014

(86) PCT No.: PCT/SG2014/000074
§ 371 (c)(1),
(2) Date: Aug. 21, 2015

(87) PCT Pub. No.: WO2014/129976
PCT Pub. Date: Aug. 28, 2014

(65) Prior Publication Data
US 2016/0013139 A1 Jan. 14, 2016

Related U.S. Application Data

(60) Provisional application No. 61/767,289, filed on Feb. 21, 2013.

(51) Int. Cl.
*H01L 23/12* (2006.01)
*H01L 23/00* (2006.01)
(Continued)

(52) U.S. Cl.
CPC .......... *H01L 23/562* (2013.01); *H01L 21/486* (2013.01); *H01L 21/4828* (2013.01);
(Continued)

(58) Field of Classification Search
CPC ... H01L 23/24; H01L 23/49861; H01L 24/97; H01L 23/562; H01L 21/4817; H01L 21/486
(Continued)

(56) References Cited

U.S. PATENT DOCUMENTS 6,008,536 A * 12/1999 Mertol ................. H01L 23/367
257/704
6,822,867 B2 * 11/2004 Hsieh ..................... H01L 23/40
165/185
(Continued)

OTHER PUBLICATIONS

Search Report and Written Opinion in International Application No. PCT/SG2014/000074 dated Apr. 7, 2014.

*Primary Examiner* — Nitin Parekh
(74) *Attorney, Agent, or Firm* — Marshall, Gerstein & Borun LLP

(57) ABSTRACT

A semiconductor structure and a method of fabricating the same. The semiconductor structure comprises: a layer element, one or more supporting elements disposed on a first surface of the layer element, and one or more anchoring elements disposed within the layer element and connected to the one or more supporting elements to couple the one or more supporting elements to the layer element to strengthen the layer element.

23 Claims, 12 Drawing Sheets

(51) Int. Cl.
*H01L 23/544* (2006.01)
*H01L 21/48* (2006.01)
*H01L 21/56* (2006.01)
*H01L 23/495* (2006.01)
*H01L 23/498* (2006.01)

(52) U.S. Cl.
CPC ........ *H01L 21/4842* (2013.01); *H01L 21/565* (2013.01); *H01L 23/49541* (2013.01); *H01L 23/544* (2013.01); *H01L 23/49827* (2013.01); *H01L 24/97* (2013.01); *H01L 2223/54426* (2013.01); *H01L 2223/54486* (2013.01)

(58) Field of Classification Search
USPC .......................................... 257/704; 438/118
See application file for complete search history.

(56) References Cited

U.S. PATENT DOCUMENTS

| | | | |
|---|---|---|---|
| 6,943,436 B2* | 9/2005 | Radu | H01L 23/552 257/659 |
| 7,271,479 B2* | 9/2007 | Zhao | H01L 23/055 257/704 |
| 2005/0088833 A1* | 4/2005 | Kikuchi | H01L 23/13 361/763 |
| 2005/0151246 A1* | 7/2005 | Daeche | H01L 21/4857 257/723 |
| 2007/0040267 A1* | 2/2007 | Zhao | H01L 21/50 257/706 |
| 2009/0243065 A1* | 10/2009 | Sugino | H01L 23/16 257/686 |
| 2009/0291530 A1 | 11/2009 | Jimmy et al. | |
| 2011/0210429 A1* | 9/2011 | Lim | H01L 21/4846 257/659 |
| 2011/0210439 A1 | 9/2011 | Lim et al. | |
| 2012/0058604 A1 | 3/2012 | Chew et al. | |
| 2012/0168206 A1* | 7/2012 | Sekine | H01L 33/642 174/252 |
| 2013/0175707 A1* | 7/2013 | Chew | H01L 23/49537 257/778 |

* cited by examiner

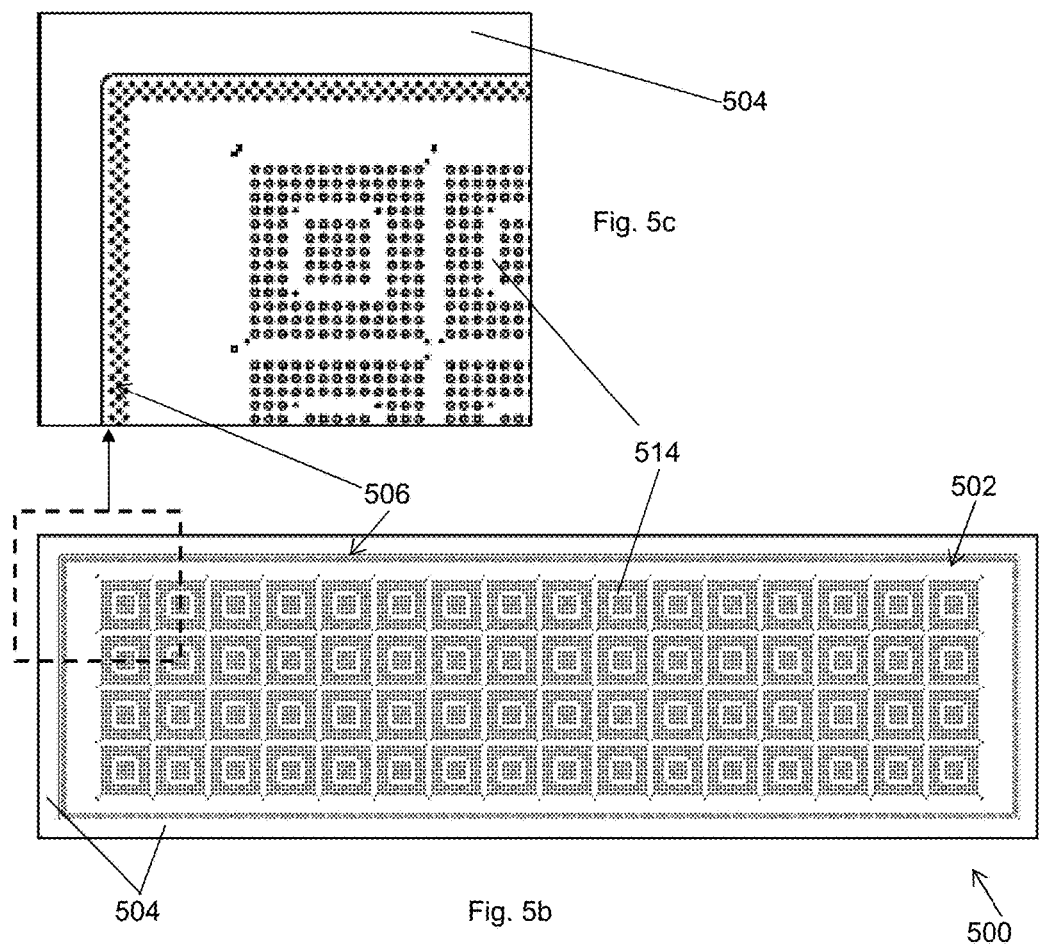
Fig. 5c
Fig. 5b
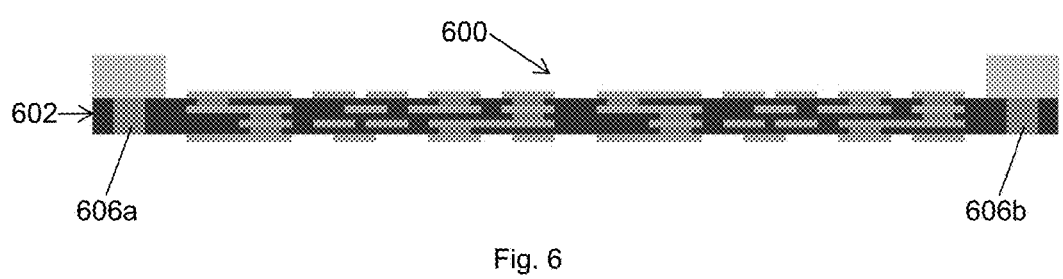
Fig. 6

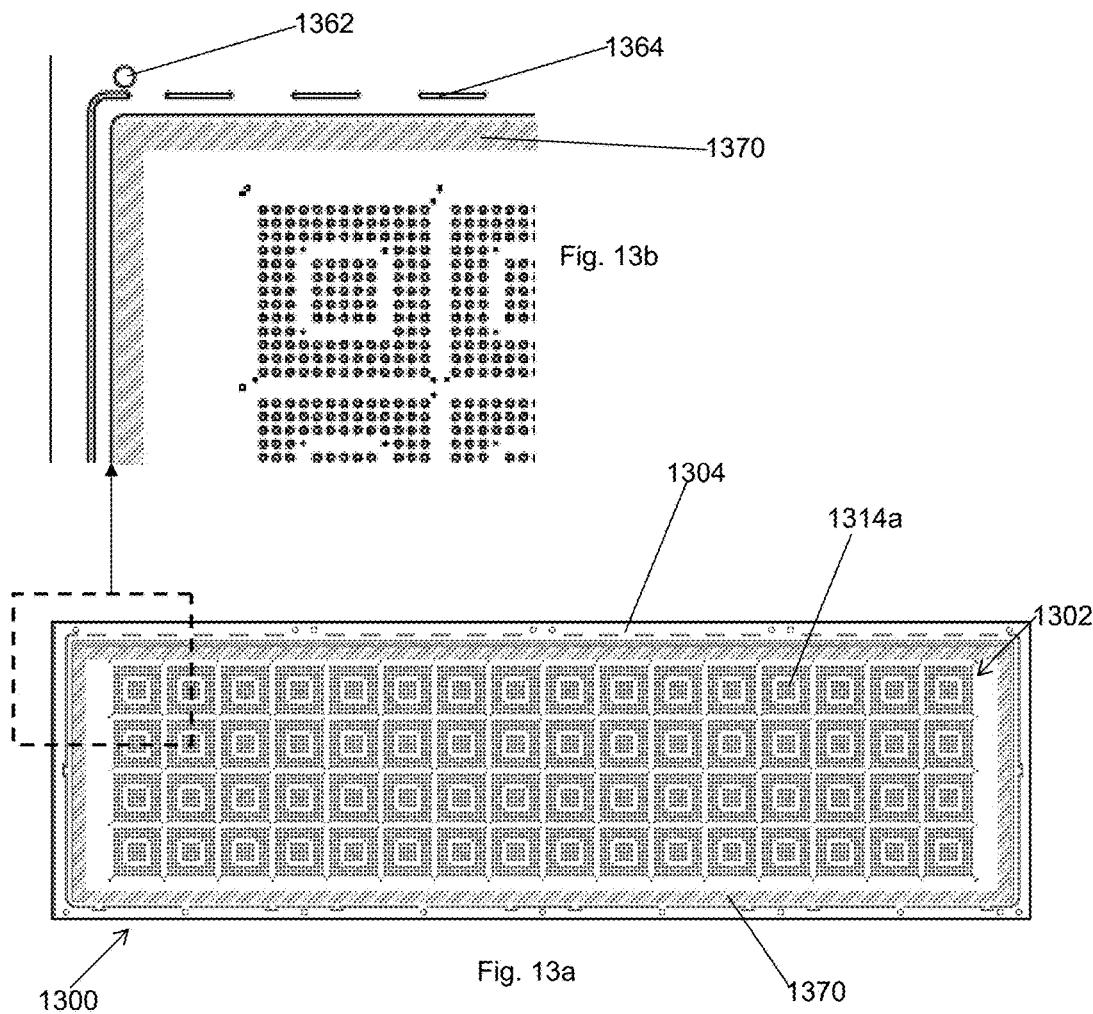
Fig. 13b
Fig. 13a
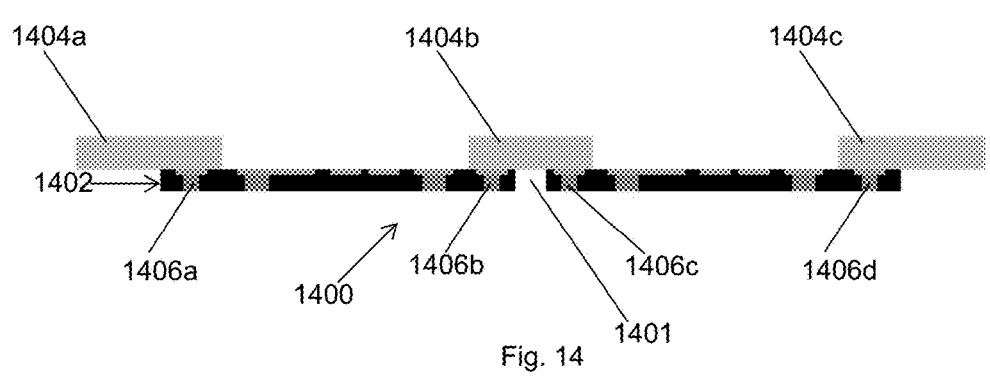
Fig. 14

Fig. 17d
Fig. 17e
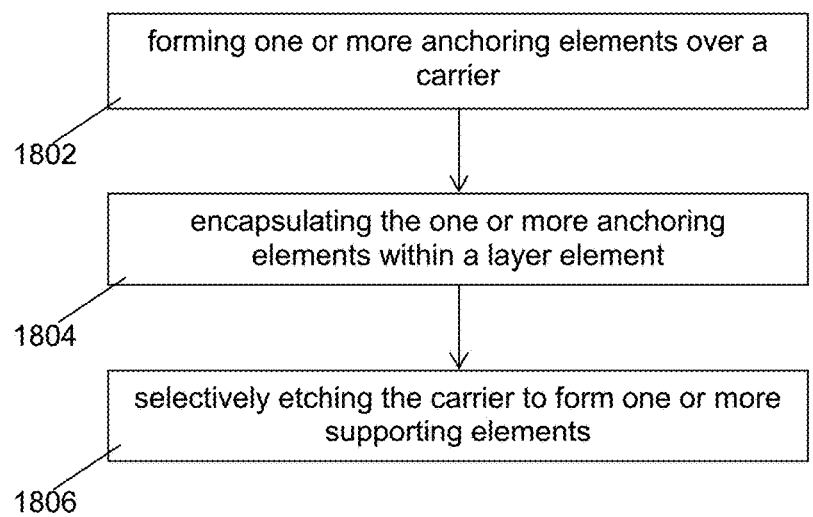
Fig. 18
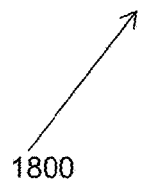

SEMICONDUCTOR STRUCTURE AND METHOD OF FABRICATING THE SAME

FIELD OF INVENTION

The invention relates to a semiconductor structure and a method of fabricating the same.

BACKGROUND

The emergence of electronic devices such as smartphones, tablets and portable computers has resulted in an increase in demand for high performance integrated circuits (ICs). These electronic devices are continually moving toward higher functionality and size miniaturization. In order to keep up with this trend, IC packages are becoming smaller, thinner and more compact.

It is possible to reduce the size and thickness of IC packages by increasing wiring density and reducing the thickness of substrates used in IC packages. However, as substrate thickness is reduced, the substrate becomes more prone to damage (such as cracks or dents) during handling and subsequent assembly process steps. This is especially prevalent when the material used for the substrate has a high flexural modulus (in order to achieve a low coefficient of thermal expansion (CTE)). This is more apparent as the size of the substrate increases to accommodate more device units on each substrate in order to reduce manufacturing cost.

A need therefore exists to provide a semiconductor structure and a method of fabricating the same that seeks to address at least one of the abovementioned problems.

SUMMARY

According to the first aspect of the invention, there is provided a semiconductor structure, comprising: a layer element; one or more supporting elements disposed on a first surface of the layer element, and one or more anchoring elements disposed within the layer element and connected to the one or more supporting elements to couple the one or more supporting elements to the layer element to strengthen the layer element.

In an embodiment, a portion of at least one of the one or more anchoring elements may be exposed on a second surface of the layer element, the second surface being opposite the first surface.

In an embodiment, the semiconductor structure may further comprise one or more reinforcement elements disposed on at least a portion of the second surface of the layer element, wherein the one or more anchoring elements may be connected to the one or more reinforcement elements to couple the one or more reinforcement elements to the layer element to further strengthen the layer element.

In an embodiment, the semiconductor structure may further comprise one or more reinforcement elements disposed on at least a portion of the one or more supporting elements to further strengthen the layer element.

In an embodiment, the one or more supporting elements may comprise a magnetic material. The one or more supporting elements may further comprise a coating, the coating being disposed over at least a portion of the magnetic material.

In an embodiment, the one or more supporting elements may be disposed at an edge portion of the layer element. In an embodiment, a portion of the one or more supporting elements may extend beyond the edge of the layer element to define an overhang portion. The overhang portion may comprise one or more through-holes.

In an embodiment, the layer element may comprise an insulating substrate layer element having one or more electrical elements.

In an embodiment, the semiconductor structure may comprise one supporting element, wherein the one supporting element extends around the perimeter of the carrier element.

In an embodiment, at least one of the one or more anchoring elements may be a pillar or column.

In an embodiment, the semiconductor structure may further comprise a further layer element; and one or more further anchoring elements may be disposed within the further layer element and connected to the one or more anchoring elements of the layer element to strengthen both the layer element and the further layer element.

According to the second aspect of the invention, there is provided method of fabricating a semiconductor structure, the method comprising: forming one or more anchoring elements over a carrier; encapsulating the one or more anchoring elements within a layer element; and selectively etching the carrier to form one or more supporting elements.

In an embodiment, the method may further comprise forming one or more electrical elements over the carrier.

In an embodiment, the method may further comprise forming one or more through-holes in the one or more supporting elements.

In an embodiment, the method may further comprise planarizing the layer element to expose at least a portion of at least one of the one or more anchoring elements.

In an embodiment, the method may further comprise forming one or more reinforcement elements over at least a portion of the one or more exposed anchoring elements.

In an embodiment, the method may further comprise forming one or more reinforcement elements over at least a portion of the one or more supporting elements.

In an embodiment, the method may further comprise forming a coating over at least a portion of an inner magnetic core; the inner magnetic core and coating defining the carrier.

In an embodiment, the method may further comprise forming one or more dividing gaps in the layer element.

BRIEF DESCRIPTION OF THE DRAWINGS

Example embodiments of the invention will be better understood and readily apparent to one of ordinary skill in the art from the following written description, by way of example only, and in conjunction with the drawings, in which:

FIG. 6 is a cross-section view of a semiconductor structure, according to another embodiment of the invention.

FIG. 13a and b is a bottom and enlarged view, respectively, of a semiconductor structure, according to an embodiment of the invention.

FIG. 14 is a cross-section view of a semiconductor structure, according to another embodiment of the invention.

FIG. 18 is a flow chart illustrating the steps of a method of fabricating a semiconductor structure, according to an embodiment of the invention.

DETAILED DESCRIPTION

Figure 1:
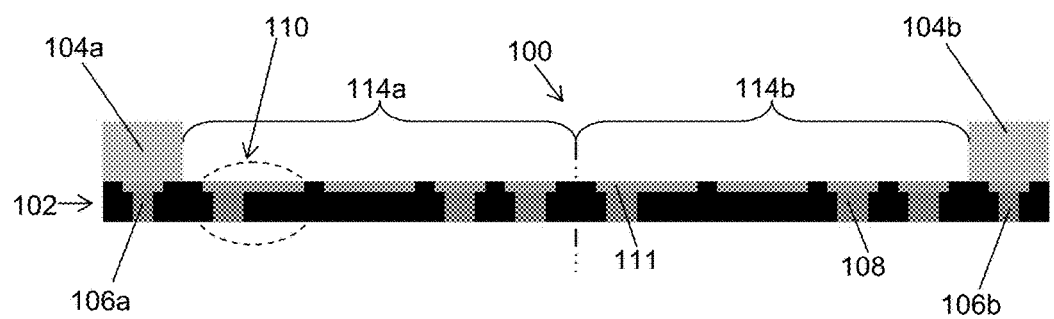
FIG. 1 is a cross-section view of a semiconductor structure, according to an embodiment of the invention.

Embodiments of the present invention will be described with reference to the drawings. Like reference numerals and characters in the drawings refer to like elements or equivalents.

FIG. 1 is a schematic of a semiconductor structure, designated generally as reference numeral 100, according to an embodiment of the present invention. The semiconductor structure 100 comprises a layer element 102; two supporting (stiffening) elements 104a/104b disposed on a first surface of the layer element 102; and two anchoring (locking) elements 106a/106b disposed within the layer element 102, and connected to the two supporting elements 104a/104b, respectively. The two anchoring elements 106a/106b are connected to the two supporting elements 104a/104b, respectively, to couple the two supporting elements 104a/104b to the layer element 102. The supporting elements 104a/104b and anchoring elements 106a/106b provide support for handling and transportation, and/or to mechanically strengthen/stiffen the layer element 102. In an embodiment, the layer element 102 may be a carrier element.

The layer element 102 may be a part of or a whole of a substrate of the semiconductor structure 100. The layer element 102 may comprise a plurality of electrical elements (e.g. 110) embedded within a dielectric body or layer. There may be one or more device units (e.g. 114a/114b) defined in the substrate, each for receiving one or more semiconductor devices, e.g. an integrated circuit (IC) chip or a passive component. At least one electrical element (in each device unit) may connect the top surface of the layer element 102 to the bottom surface (through the layer element 102). Each of the plurality of electrical elements may comprise one or more wiring traces (e.g. 111) and/or one or more vertical vias (e.g. 108). The wiring traces may be lines or pads and the vertical vias may be studs, pillars or columns (cylindrical or cuboid in shape). Preferably, the plurality of electrical elements (e.g. 110) is isolated from one another.

The layer element may be configured to receive and connect with at least one semiconductor device (not shown) on the top first surface (and/or the bottom second surface) and routes the electrical signals from the semiconductor device to the bottom second surface (and/or the top first surface) of the layer element via the electrical elements. In an embodiment, the supporting elements (and the anchoring elements) may be disposed away from and/or circumvent the semiconductor device so that they do not interfere with the attachment of the semiconductor device to the layer element.

Although only two anchoring elements and two supporting elements are shown in FIG. 1, in alternative embodiments, there may be one or more supporting elements disposed over the layer element, and/or one or more anchoring elements disposed within the layer element.

The supporting and anchoring elements may be disposed over a selected segment on any part of the layer element depending on product requirements. Preferably, the supporting and anchoring elements are disposed at an edge portion of the layer element (i.e. around the periphery of the layer element). One anchoring element may be connected to one or more supporting elements. One supporting element may be connected to one or more anchoring elements. The anchoring elements are embedded within dielectric body of the layer element and anchor the supporting elements to the layer element.

In an embodiment, the anchoring elements 106a/106b may be completely masked by the supporting elements 104a/104b and non-exposed on the first surface of the layer element 102. That is, the anchoring elements 106a/106b extend from the supporting elements 104a/104b on the first surface of the layer element 102 towards the second surface of the layer element 102 through the dielectric body of the layer element.

In FIG. 1, the anchoring elements 106a/106b are embedded in the layer element 102 such that one end (the base) of the anchoring element is exposed on a second surface of the layer element, the second surface (i.e. bottom surface of layer element 102) being opposite the first surface (i.e. the top surface of the layer element 102). Thus, the thickness (i.e. height) of the anchoring elements 106a/106b is equal to that of the layer element 102.

Figure 2:
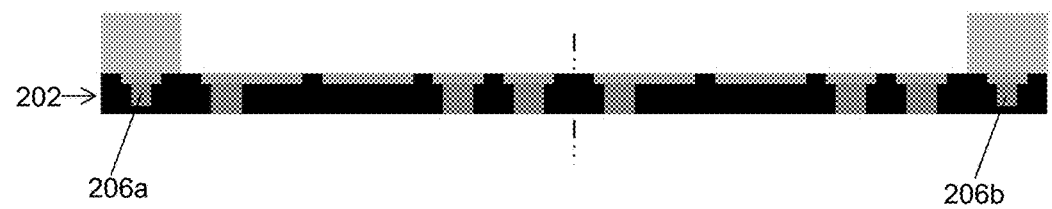
FIG. 2 is a cross-section view of a semiconductor structure, according to another embodiment of the invention.

Alternatively, as shown in FIG. 2, the anchoring elements 206a/206b are completely embedded in the layer element 202 such that the base portion of the anchoring element is not exposed on the second surface of the layer element (i.e. the bottom surface of the layer element 202). In other words, the thickness (i.e. height) of the anchoring elements 206a/206b is smaller than that of the layer element 202.

The supporting elements (which are connected to the anchoring elements) are coupled to the layer element to enhance the structural integrity of the layer element to facilitate handling and subsequent assembly of IC chips. Accordingly, embodiments of the present invention advantageously allow thinner and larger substrates to be used, and may also minimize warpage of the substrate. The supporting and anchoring elements may be separately assembled to the substrate or formed as an integral part of the substrate during fabrication, and may adhere strongly to the substrate in order to prevent detachment from the substrate during subsequent processing.

The supporting elements may be cylindrical pillars or columns extending from the anchoring elements away the layer element. Similarly, the anchoring elements may be cylindrical pillars or columns extending from the supporting elements into the layer element. Other shapes are possible, such as oval, diamond, square, rectangular, cross or T-shape. Alternatively, the supporting elements and/or the anchoring elements may be segmented or connected blocks (of wall), each spanning in (horizontal) length on the layer element.

In an embodiment, the semiconductor structure may comprise one supporting element in the form of a ring or a wall that extends partially/completely around the perimeter of the layer element. A plurality of anchoring elements, in the form of cylindrical pillars, may be distributed along the length of the supporting element to anchor the supporting element onto the layer element. In the case of a continuous wall spanning along the periphery of the layer element, the supporting element may define one or more cavities with the layer element within which the device units of the layer element are located and circumvented by the supporting element. Each device unit may receive and connect with at least one semiconductor device disposed within the cavity.

The anchoring element may further comprise at least two sections, an upper section and a lower section as shown in FIG. 1. In one embodiment, the anchoring element may be shaped like a rivet having a top cap as the upper section and a vertical shaft as the lower section. The top cap has a larger width/diameter than that of the vertical shaft. A plurality of rivets may be distributed partially/completely around the perimeter of the layer element. This advantageously increases the area of contact with the layer element to enhance the reliability of the semiconductor structure.

In another embodiment, the upper section may be a block and the lower section may be a plurality of pillars or columns distributed (in array) on the block and extending from the upper section into the layer element. A plurality of segmented blocks or a continuous block may be spanning along the periphery of the layer element. When the supporting element is in the form of a continuous wall, the upper section (block) is covered and connected to the supporting element.

In an embodiment, the supporting elements 104a/104b and the anchoring elements 106a/106b may be formed as an integral part of the layer element. The anchoring elements may be embedded within the dielectric body of the layer element and may be formed simultaneously with the electrical elements. In this way, the anchoring elements may have the same layered structure as the electrical elements. Preferably, the supporting elements and anchoring elements are isolated from the electrical elements. The plurality of electrical elements may comprise wiring traces and/or vertical vias. The wiring traces may be lines or pads and the vertical vias may be studs, pillars or columns (cylindrical or cuboid).

In one embodiment, the semiconductor structure may comprise a substrate formed by in part or in whole by one layer element. The layer element has a first surface and a second surface opposite the first surface. The wiring traces and vertical vias are embedded within the dielectric body of the layer element such that the thickness of the electrical element is equal or lesser than that of the dielectric body. At least one vertical via may be connected to one wiring traces. Each wiring trace has a top and bottom surfaces and each vertical via has a top end and a base end. The top surfaces of the wiring traces are exposed on the first surface of the layer element and may be leveled or recessed (less than 15 um depth) into the dielectric body. The top ends of the vertical vias are connected to the bottom surfaces of the wiring traces such that the vertical vias extend from the wiring traces to the second surface of the layer element. The base ends of the vertical vias are exposed on the second surface of the layer element and may be leveled or recessed (less than 15 um depth) into the dielectric body.

Figure 3:
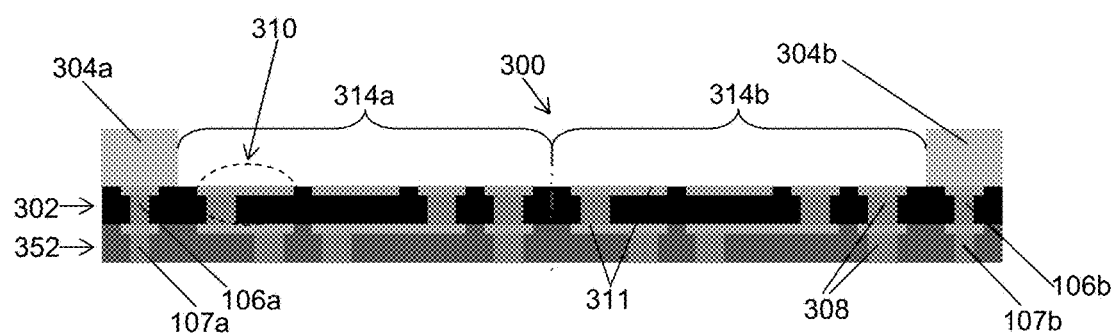
FIG. 3 is a cross-section view of a semiconductor structure, according to an embodiment of the invention.

In an alternative embodiment, the semiconductor structure may comprise a substrate formed by a plurality of layer elements (i.e. a "multilayer" substrate). FIG. 3 is a schematic of a semiconductor structure, designated generally as reference numeral 300, comprising two layer elements 302/352, supporting elements 304a/304b and anchoring elements 106a, 106b, 107a, 107b. Anchoring element 106a is connected to supporting element 304a to couple the supporting element 304a to the layer elements 302/352 to strengthen the layer elements 302/352. Similarly, anchoring element 106b is connected to supporting element 304b to couple the supporting element 304b to the layer elements 302/352 to strengthen the layer elements 302/352.

A plurality of anchoring elements may be embedded within the dielectric body of each layer element. The anchoring elements in one layer element may be disposed on and connected to the anchoring elements in the next layer element. As shown in FIG. 3, anchoring elements 107a and 107b are connected to anchoring elements 106a and 106b, respectively. The shape or structure of the anchoring element in one layer element may be different from that of the other layer element.

Each layer element 302/352 may comprise a plurality of wiring traces (e.g. 311) and/or vertical vias (e.g. 308) embedded within the dielectric body or layer of each of the two layer elements 302/352. The wiring traces may be lines or pads and the vertical vias may be studs, pillars or columns (cylindrical or cuboid). The wiring traces and vertical vias in each layer element form a plurality of electrical elements (e.g. 310) that define at least one device unit (e.g. 314a/314b) or an array of device units in the substrate.

Each layer element 302/352 has a first surface and a second surface opposite the first surface. The wiring traces and vertical vias of each layer element are embedded within the dielectric body of each layer element such that the thickness of the wiring trace and vertical via is equal or lesser than that of each dielectric body. At least one vertical via may be connected to one wiring trace in each layer element. In each layer element, the wiring trace has a top and bottom surface and the vertical via has a top end and a base end. The top surfaces of the wiring traces are exposed on the first surface of the layer element and may be leveled or recessed into the dielectric body. The top ends of the vertical vias are connected to the bottom surfaces of the wiring traces such that the vertical vias extend from the wiring traces to the second surface of the layer element. The base ends of the vertical vias are exposed on the second surface of the layer element and may be leveled or recessed into the dielectric body.

The plurality of layer elements 302/352 are disposed on or stacked on one another such that the second surface of one layer element (e.g. 302) corresponds to the first surface of a second layer element (e.g. 352). The electrical elements are connected together such that the base end of the vertical vias of one layer element is connected to the top surface of the wiring traces of the next layer element. At least one vertical via may be disposed between the wiring traces of two adjacent layer elements. Consequently, the electrical elements connect the first surface of the uppermost layer element to the second surface of the lowermost layer element (through the plurality of layer elements).

The anchoring elements may have the same layered structure as the electrical elements in each layer element. In similar manner, anchoring element 106a may be disposed on or stacked on top of anchoring element 107a; and anchoring element 106b may be disposed on or stacked on top of anchoring element 107b.

An adhesion layer or film may be disposed between two layer elements such that the adhesion layer interfaces between the first surface of one layer element and the second surface of an adjacent layer element. The vertical vias in one layer element may extend through the adhesion layer to connect to the wiring trace of the next layer element. Similarly, the anchoring element in one layer element may extend through the adhesion layer to connect to the anchoring element of the next layer element.

Figure 4:
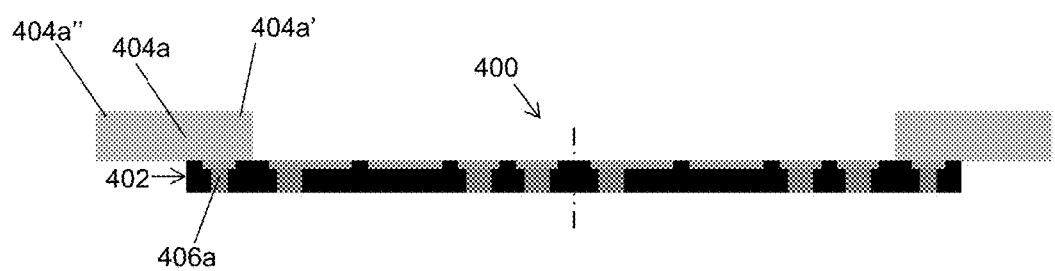
FIG. 4 is a cross-section view of a semiconductor structure, according to another embodiment of the invention.

FIG. 4 is a schematic of a semiconductor structure, designated generally as reference numeral 400, according to an embodiment of the present invention. In this embodiment, a portion of the supporting element may extend beyond the edge of the layer element 402. The inner portion 404a' of the supporting element 404a falls within the projection planar area of the layer element 402. The inner portion 404a' overlaps (i.e. is superimposed on) and attaches to the layer element 402 and the anchoring element 406a. The outer portion 404a" of the supporting element 404a falls outside the projection planar area of the layer element 402. The outer portion 404a" overhangs outside the periphery of the layer element 402 and advantageously provides additional area for handling and clamping during subsequently assembly with semiconductor devices.

Figure 5A:
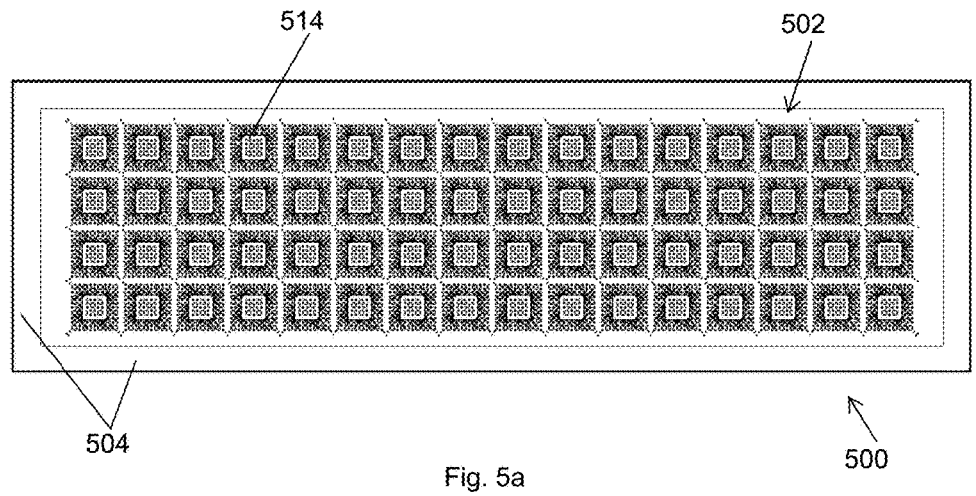
FIG. 5a, b and c is a top, bottom and enlarged view, respectively, of a semiconductor structure, according to an embodiment of the invention.

FIG. 5a and b is a top and bottom view, respectively, of a semiconductor structure, designated generally as reference numeral 500, according to an embodiment of the present invention. The semiconductor structure 500 comprises a layer element 502; supporting elements 504 disposed over the layer element 502; and anchoring elements 506 (only visible in FIG. 5b; hidden below the supporting elements 504 in FIG. 5a) disposed within the layer element 502, and connected to the supporting elements 504. The anchoring elements 506 are connected to the supporting elements 504 to couple the supporting elements 504 to the layer element 502 to strengthen the layer element 502. The inner portion of the supporting elements fall within the projection planar area of the layer element 502. The inner portion overlaps and attaches to the layer element 502 and the anchoring elements 506. The outer portion of the supporting elements falls outside the projection planar area of the layer element 502. The outer portion overhangs outside the periphery of the layer element 502 and advantageously provides additional area for handling and clamping during subsequently assembly with semiconductor devices. The layer element 502 may be a substrate of the semiconductor structure 500. There may be one or more device units (e.g. 514a) defined in the substrate.

FIG. 5c is an enlarged view of a bottom portion of the semiconductor structure 500, according to an embodiment of the present invention. The anchoring elements 506 may be arranged in a grid or an array. For example, as seen in FIG. 5c, the anchoring elements are arranged in three offset rows. The supporting and anchoring elements are disposed around the layer element continuously to form a ring. However, in another embodiment they may be disposed around the layer element non-continuously.

In yet another embodiment, the layer element may be a pre-fabricated substrate that is formed prior to the formation of the supporting elements and/or the anchoring elements. The pre-fabricated substrate may be a bismaleimide-triazine (BT) substrate, ceramic substrate, flexible plastic substrate, pre-molded substrate or printed circuit board (PCB). The supporting elements and the anchoring elements may be attached to the layer elements by adhesive or mechanical means. For instance, holes may be formed by laser or mechanical drilling into the substrate and the anchoring elements may be tightly-fitted into the drilled holes to attach the supporting elements to the substrate (with or without adhesive). Preferably, the pre-fabricated substrate comprises a plurality of wiring layers and the anchoring elements extend though two or more wiring layers.

FIG. 6 is a schematic of a semiconductor structure, designated generally as reference numeral 600, according to another embodiment of the present invention. The semiconductor structure 600 comprises a layer element 602. The layer element 602 may be a pre-fabricated substrate. The anchoring elements 606a/606b are embedded in the layer element 602 such that one end (e.g. the base) of the anchoring element is exposed on a second surface (i.e. bottom surface) of the layer element 602, the second surface being opposite the first surface (i.e. the top surface) of the layer element 602. The thickness (i.e. height) of the anchoring elements 606a/606b is equal or greater than that of the layer element 602.

Figure 7:
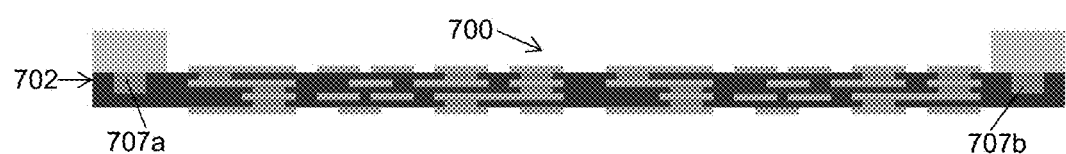
FIG. 7 is a cross-section view of a semiconductor structure, according to a further embodiment of the invention.

FIG. 7 is a schematic of a semiconductor structure, designated generally as reference numeral 700, according to a further embodiment of the present invention. The semiconductor structure 700 comprises a layer element 702. The layer element 702 may be a pre-fabricated substrate. The anchoring elements 706a/706b are completely embedded in the layer element 702 such that the base portion of the anchoring element is not exposed on the second surface (the bottom surface) of the layer element 702. In other words, the thickness (height) of the anchoring elements 706a/706b is smaller than that of the layer element 702.

Figure 8:
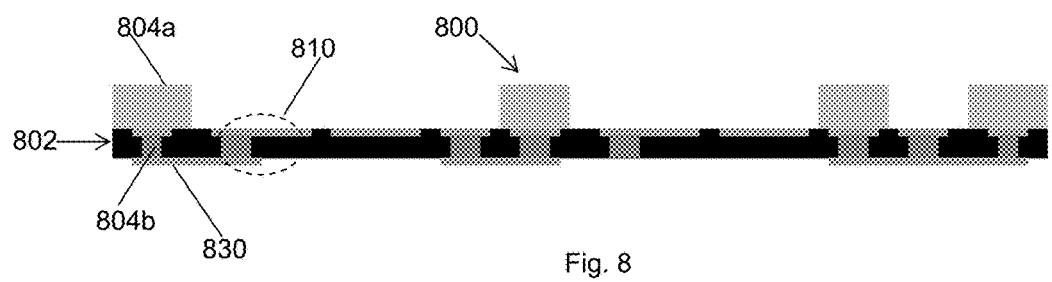
FIG. 8 is a cross-section view of a semiconductor structure, according to yet another embodiment of the invention.

FIG. 8 is a schematic of a semiconductor structure, designated generally as reference numeral 800, according to yet another embodiment of the present invention. The semiconductor structure 800 is substantially the same as semiconductor structure 200 described above, except that semiconductor structure 800 further comprises a surface trace wiring layer 830. The surface trace wiring layer 830 may be disposed on at least a portion of a second surface (the bottom surface) of the layer element 802. The surface trace wiring layer 830 may be similar to the wiring trace layer (e.g. 311) described above and may electrically connect at least two electrical elements together. The surface trace wiring layer 830 may also connect an anchoring element (e.g. 806a) to an electrical element (e.g. 810) such that a support element (e.g. 804a) may be electrically connected to the electrical element via the anchoring element. As shown in FIG. 8, the supporting element may be disposed in the central area of the layer element. Preferably in this case, the support element may be a pillar or column and may be used for connection with an external chip or assembly disposed on top of the semiconductor structure. The surface trace wiring layer 830 may comprise a plurality of traces connecting between the exposed end of the anchoring elements and the electrical elements. Alternatively, the surface trace wiring layer 830 may be a planar pad covering one or more anchoring elements and/or one or more electrical elements.

Figure 9:
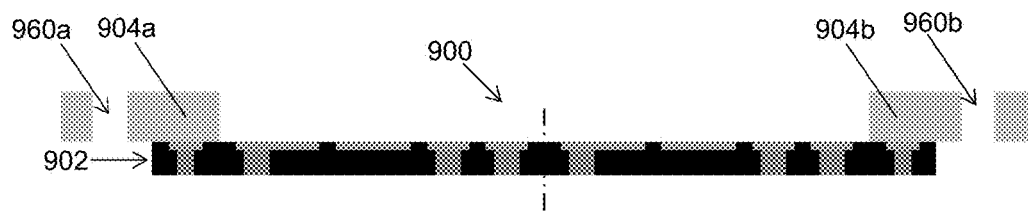
FIG. 9 is a cross-section view of a semiconductor structure, according to another embodiment of the invention.

FIG. 9 is a schematic of a semiconductor structure, designated generally as reference numeral 900, according to another embodiment of the present invention. The semiconductor structure 900 is substantially the same as semiconductor structure 400 described above, except that the supporting elements 904a/904b comprises a through-hole 960a/960b that spans from the top surface of the supporting element to the bottom surface. The through-hole 960a/960b is preferably formed on the outer portion of the supporting elements that overhangs outside the periphery of the layer element 902. The through-holes 960a/960b may be formed by mechanical means (e.g. cutting or punching) or by etching.

The through-holes 960a/960b may function as positioning holes to facilitate accurate alignment of the substrate during subsequent assembly with semiconductor devices. The through-hole 960a/960b may also function as a stress-distribution slot/hole for minimizing warpage of the substrate before and after assembly with semiconductor devices. The through-hole 960a/960b can be of any suitable shape, including circular, oval, rectangular.

Figure 10:
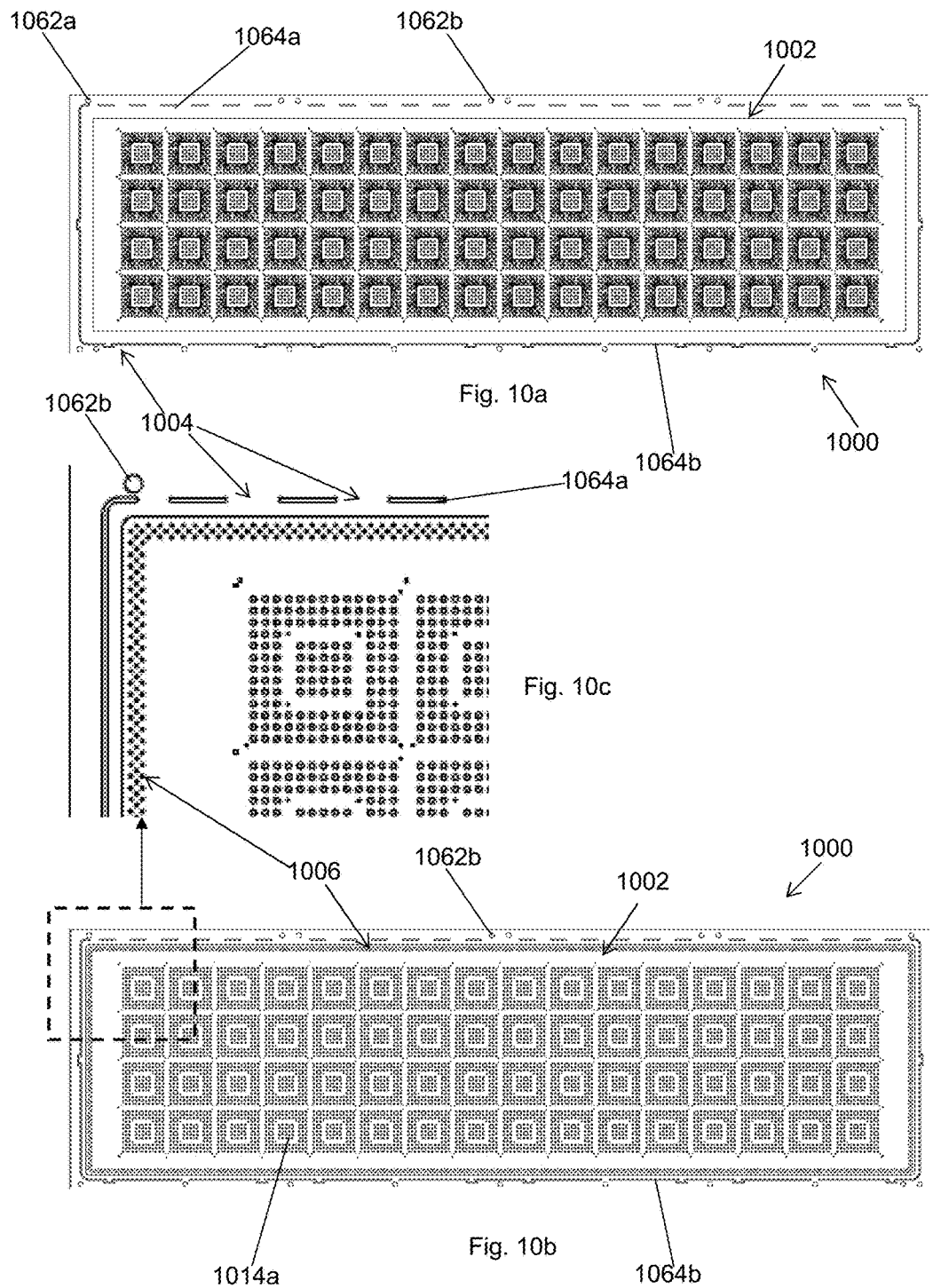
FIG. 10a, b and c is a top, bottom and enlarged view, respectively, of a semiconductor structure, according to an embodiment of the invention.

FIG. 10a and b is a top and bottom view, respectively, of a semiconductor structure, designated generally as reference numeral 1000, according to an embodiment of the present invention. FIG. 10c is an enlarged view of a bottom portion of the semiconductor structure 1000. The semiconductor structure 1000 comprises a layer element 1002; supporting elements 1004 disposed over the layer element 1002; and anchoring elements 1006 (only visible in FIG. 10b; hidden below the supporting elements in FIG. 10a) disposed within the layer element 1002, and connected to the supporting elements 1004. The anchoring elements 1006 are connected to the supporting elements 1004 to couple the supporting elements 1004 to the layer element 1002 to strengthen the layer element 1002. The layer element 1002 may be a substrate of the semiconductor structure 1000. There may be one or more device units (e.g. 1014a) defined in the substrate. The supporting elements 1004 comprise through-holes that span from the top surface of the supporting elements to the bottom surface. The through-hole may be a positioning hole (e.g. 1062a/1062b) to facilitate accurate alignment of the substrate during subsequent assembly with semiconductor devices. The through-hole may be a stress-distribution slot (e.g. 1064a/1064b) for minimizing warpage of the substrate before and after assembly with semiconductor devices. The through-hole may be aligned with and/or offset from each other. Also, different through-holes may have different shapes.

Figure 11:
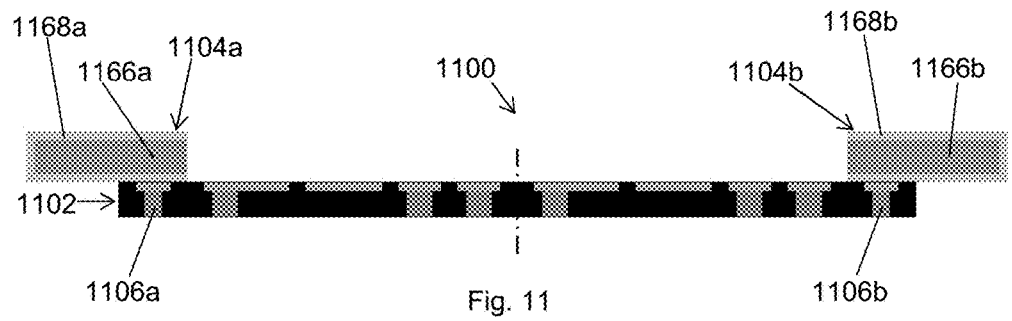
FIG. 11 is a cross-section view of a semiconductor structure, according to another embodiment of the invention.

FIG. 11 is a schematic of a semiconductor structure, designated generally as reference numeral 1100, according to another embodiment of the present invention. The semiconductor structure 1100 is substantially the same as semiconductor structure 400 described above, except that the supporting elements 1104a/1104b may comprise an inner core 1166a/1166b and an outer coating 1168a/1168b. The inner core 1166a/1166b may comprise a magnetic material, such as steel. The outer coating 1168a/1168b covers at least a portion of the inner core 1166a/1166b and acts as an interface between the inner core 1166a/1166b and the anchoring elements 1106a/1106b as well as the layer element 1102. The outer coating 1168a/1168b preferably has a higher chemical and mechanical resistance than the inner core 1166a/1166b and serves as a protective layer, to minimize corrosion and damage to the inner core 1166a/1166b. The outer coating 1168a/1168b also serves as an adhesion layer to improve adhesion to the layer element 1102 and the anchoring elements 1106a/1106b. The outer coating 1168a/1168b is preferably made of copper, nickel, gold, palladium, titanium, chromium, or a combination of any of the above elements disposed in layers.

Figure 12A:
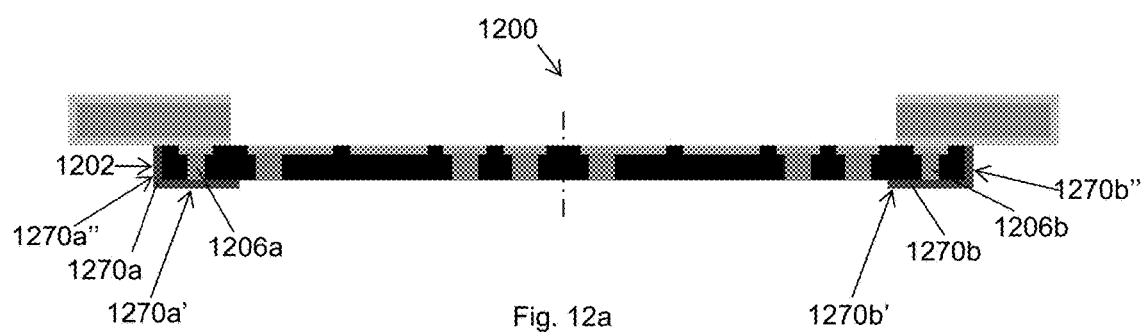
FIG. 12a-c are cross-section views of a semiconductor structure, according to embodiments of the invention.

FIG. 12a is a schematic of a semiconductor structure, designated generally as reference numeral 1200, according to another embodiment of the present invention. The semiconductor structure 1200 is substantially the same as semiconductor structure 1100 described above, except that the semiconductor structure 1200 further comprises one or more reinforcement elements (e.g. 1270a/1270b). The reinforcement elements 1270a/1270b are connected to the anchoring elements 1206a/1206b, to couple the reinforcement elements 1270a/1270b to the layer element 1202 to further strengthen the layer element 1202. A portion (e.g. 1270a'/1270b') of the reinforcement elements 1270a/1270b may be disposed on the second surface of the layer element 1202 and may cover the base of the anchoring elements 1206a/1206b. Another portion (e.g. 1270a"/1270b") of the reinforcement elements 1270a/1270b may cover the sidewalls of the layer element 1202. The reinforcement elements 1270a/1270b may be disposed around the periphery of the layer element 1202 to form a ring (which may or may not be continuous).

Figure 12B:
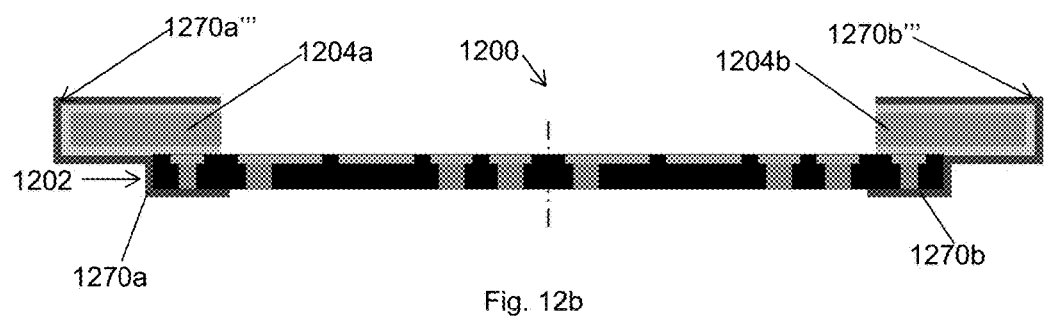

As shown in FIG. 12b, a further portion (e.g. 1270a'''/1270b''') of the reinforcement elements 1270a/1270b may also be disposed on and/or connected to at least a portion of the supporting elements 1204a/1204b to further strengthen the layer element 1202. Preferably, the reinforcement elements 1270a/1270b cover the surfaces of the supporting elements 1204a/1204b. In this way, the reinforcement elements 1270a/1270b anchor the supporting elements 1204a/1204b more strongly to the layer element 1202 to improve the rigidity and structural integrity of the layer element 1202.

Figure 12C:
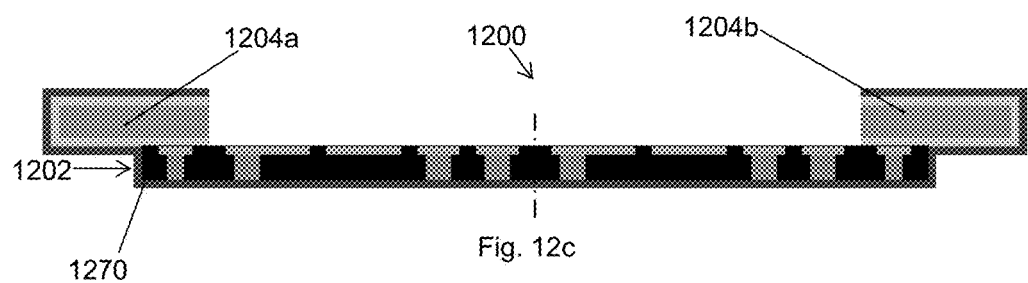

As shown in FIG. 12c, the reinforcement element 1270 may cover the entire underside of the layer element 1202 (i.e. the second surface of the layer element 1202) such that any exposed pads on the bottom surface of the layer element 1202 are covered. In this way, the reinforcement element 1270 anchors the supporting elements 1204a/1204b even more strongly to the layer element 1202 to improve the rigidity and structural integrity of the layer element 1202.

Figure 12D:
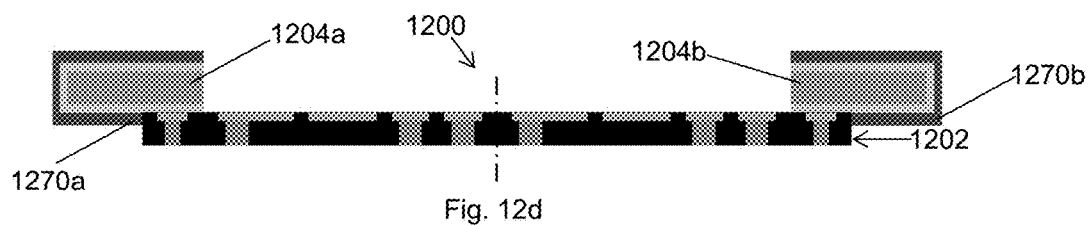

As shown in FIG. 12d, a portion of the reinforcement elements 1270a/1270b may be disposed on and/or connected to at least a portion of the supporting elements 1204a/1204b to further strengthen the layer element 1202. Preferably, the reinforcement elements 1270a/1270b cover the surfaces of the supporting elements 1204a/1204b. In this way, the reinforcement elements 1270a/1270b anchor the supporting elements 1204a/1204b more strongly to the layer element 1202 to improve the rigidity and structural integrity of the layer element 1202. In this embodiment, the reinforcement elements 1270a/1270b do not extend along the second surface of the layer element 1202.

The reinforcement elements are formed by disposing one or more layers of material on the supporting elements and/or at least a portion of the layer element. Preferably, the reinforcement elements comprise copper and formed by electroless and/or electrolytic plating. Alternatively, the reinforcement elements may be external clips or attachments that engage onto the supporting elements and/or the layer element.

The reinforcement elements, as described in FIGS. 12a, 12b, 12c and 12d, may also be formed on the semiconductor structure comprising a plurality of layer elements (e.g. FIG. 3). In this case, the sidewall refers to the sidewalls of the plurality of layer elements together; the second surface refers to the second surface of the lowermost layer element furthest away from the supporting elements.

FIG. 13a is a bottom view of a semiconductor structure, designated generally as reference numeral 1300, according to an embodiment of the present invention. FIG. 13b is an enlarged view of a bottom portion of the semiconductor structure 1300. The semiconductor structure 1300 comprises a layer element 1302; supporting elements 1304 disposed over the layer element 1302; and anchoring elements (not visible; hidden below reinforcement element 1370) disposed within the layer element 1302, and connected to the supporting elements 1304. The anchoring elements are connected to the supporting elements 1304 to couple the supporting elements 1304 to the layer element 1302 to strengthen the layer element 1302. The layer element 1302 may be a substrate of the semiconductor structure 1300. There may be one or more device units (e.g. 1314a) defined in the substrate. The supporting elements 1304 comprise through-holes that span from the top surface of the supporting elements 1304 to the bottom surface. The through-hole may be a positioning hole (e.g. 1362) to facilitate accurate alignment of the substrate during subsequent assembly with semiconductor devices. The through-hole may be a stress-distribution slot (e.g. 1364) for minimizing warpage of the substrate before and after assembly with semiconductor devices. The reinforcement element 1370 may be disposed around the periphery of the layer element 1302 to form a continuous ring. The reinforcement element 1370 is connected to the anchoring elements, to couple the reinforcement elements 1370 to the layer element 1302 to further strengthen the layer element 1302. In an embodiment, the reinforcement element 1370 is functionally similar to the supporting elements 1304.

FIG. 14 is a schematic of a semiconductor structure, designated generally as reference numeral 1400, according to another embodiment of the present invention. The semiconductor structure 1400 comprises a discontinuous layer element 1402; three supporting elements 1404a/1404b/1404c disposed on a first surface of the discontinuous layer element 1402; and four anchoring elements 1406a/1406b/1406c/1406d disposed within the discontinuous layer element 1402. Anchoring element 1406a is connected to supporting element 1404a; anchoring elements 1406b/1406c are connected to supporting element 1404b; and anchoring element 1406d is connected to supporting element 1404c. The anchoring elements are connected to the supporting elements to couple the supporting elements to the discontinuous layer element 1402. The supporting elements and anchoring elements provide support for handling and transportation, and/or to mechanically strengthen the discontinuous layer element 1402. The discontinuous layer element 1402 comprises two or more discrete sections separated by one or more dividing gaps to minimize warpage of the discontinuous layer element 1402. In FIG. 14, one dividing gap 1401 is shown.

Figures 15A, 15B, 16A:
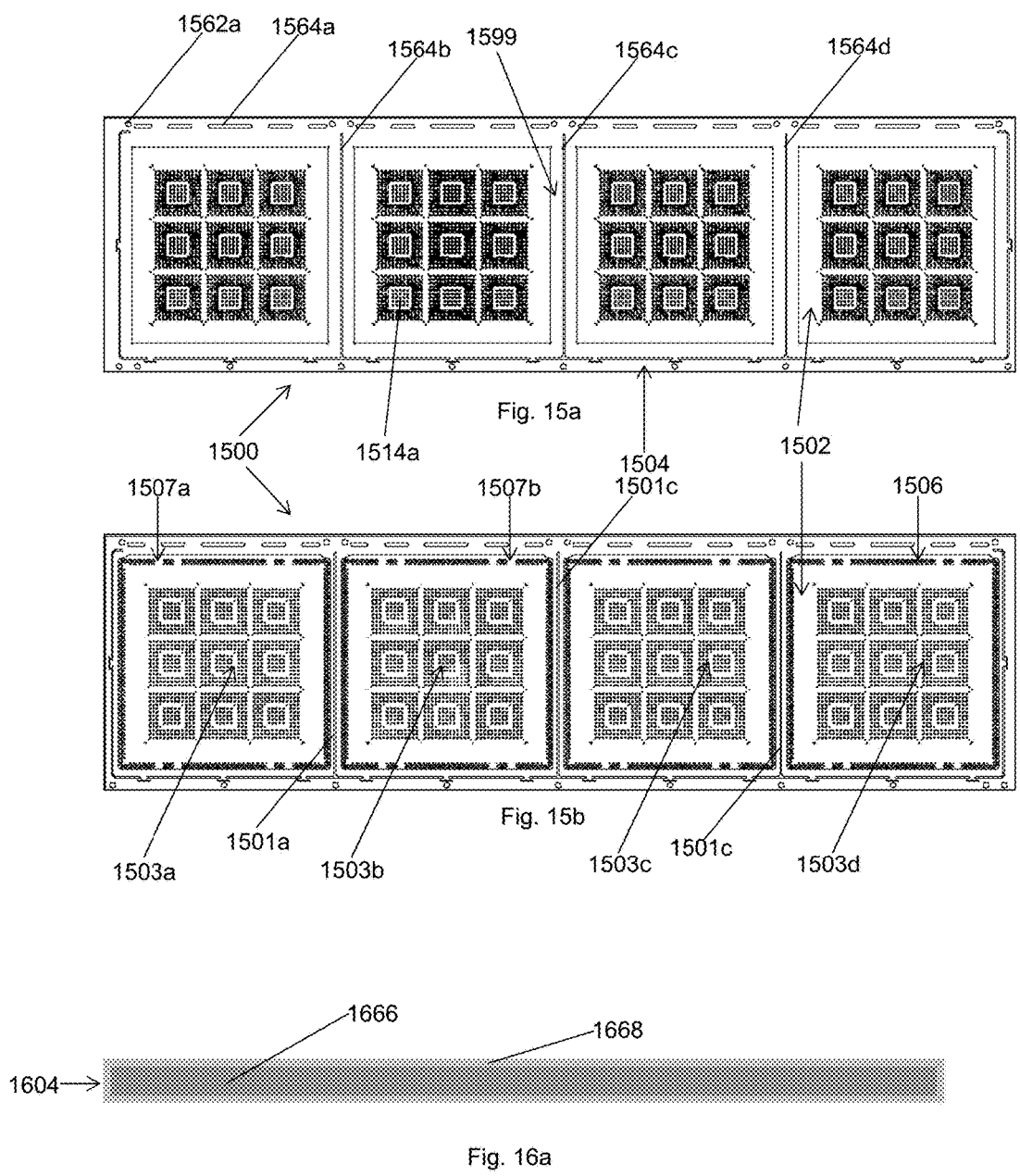
FIG. 15a and b is a top and bottom view, respectively, of a semiconductor structure, according to an embodiment of the invention.

FIG. 15a and b is a top and bottom view, respectively, of a semiconductor structure, designated generally as reference numeral 1500, according to an embodiment of the present invention. The semiconductor structure 1500 comprises a discontinuous layer element 1502; supporting elements 1504 disposed over the discontinuous layer element 1502; and anchoring elements 1506 (only visible in FIG. 15b; hidden below the supporting elements in FIG. 15a) disposed within the discontinuous layer element 1502, and connected to the supporting elements 1504.

The anchoring elements 1506 are connected to the supporting elements 1504 to couple the supporting elements 1504 to the layer element 1502 to strengthen the layer element 1502. The layer element 1502 may be a substrate of the semiconductor structure 1500. There may be one or more device units (e.g. 1514a) defined in the substrate. The device units may be arranged in groups to form an array. For example, in FIG. 15a, there are four groups of device units, each group consisting of nine device units. These thirty-six device units form an array of device units.

The supporting elements 1504 comprise through-holes that span from the top surface of the supporting elements to the bottom surface. The through-hole may be a positioning hole (e.g. 1562a) to facilitate accurate alignment of the substrate during subsequent assembly with semiconductor devices. The through-hole may be also be a stress-distribution slot (e.g. 1564a, 1564b, 1564c, 1564d) for minimizing warpage of the substrate before and after assembly with semiconductor devices. The through-hole may be aligned with and/or offset from each other. Also, different through-holes may have different shapes.

The layer element 1502 is discontinuous in the sense that there may be one or more dividing gaps (e.g. 1501a/1501b/1501c) within the layer element 1502 to divide the layer element 1502 into discrete sections 1503a/1503b/1503c/1503d. Each discrete section may comprise a group of device units.

Each discrete section 1503a/1503b/1503c/1503d may be surrounded by a plurality of anchoring elements 1506. The anchoring elements 1506 may not completely surround the discrete section (i.e. there may be gaps 1507a/1507b). For example, as shown in FIG. 15b, the anchoring elements 1506 are continuous along two out of the four sides of the discrete section. The anchoring elements 1506 are discontinuous along the other two sides of the discrete section. The layer element 1502 may be formed by molding and comprises a molding compound. The gaps (e.g. 1507a/1507b) in the anchoring elements 1506 advantageously allow the molding compound to flow without hindrance from the anchoring elements 1506 during formation of the layer element 1502.

FIG. 16 a-f are schematic cross-sectional diagrams illustrating the fabrication process of semiconductor structures according to embodiments of the invention.

Firstly, a conductive carrier is provided. Preferably, as shown in FIG. 16a, the conductive carrier 1604 may comprise an inner core 1666 and an outer coating 1668. The inner core 1666 comprises a magnetic material such as steel, and the outer coating 1668 comprises a corrosion resistant material such as copper. The outer coating 1668 may have a higher chemical resistance than the inner core 1666. The inner core 1666 may be mechanically stronger than the outer coating 1668. Alternatively, the conductive carrier may be a homogenous metal plate comprising copper, aluminum or iron. In yet another embodiment, the inner core comprises iron and the outer coating comprises nickel and/or copper.

Figure 16B:
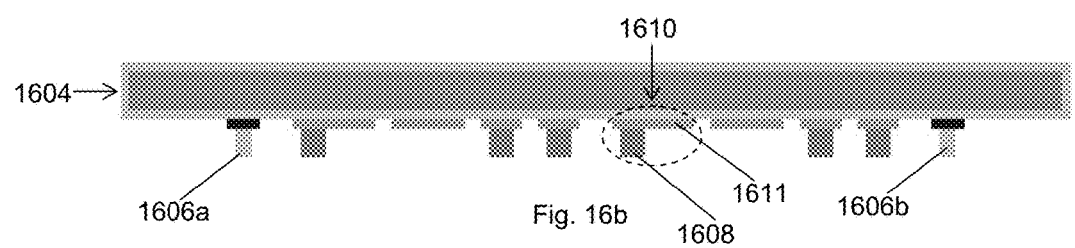
FIG. 16 a-f are cross-section diagrams illustrating the fabrication process of semiconductor structures, according to an embodiment of the invention.

Next, as shown in FIG. 16b, a plurality of anchoring elements (e.g. 1606a/1606b) and a plurality of electrical elements (e.g. 1610) are formed on the conductive carrier 1604, preferably near and around the periphery of the conductive carrier 1604. The anchoring elements are preferably formed at pre-determined locations, e.g. locations where supporting elements are to be subsequently formed. The anchoring elements 1606a/1606b and the electrical elements (e.g. 1610) may be formed by photolithography (e.g. via lamination, exposure, stripping) to create respective patterned features on a photo-sensitive layer. The anchoring elements 1606a/1606b and electrical elements (e.g. 1610) may be formed using the patterned features by full-additive, semi-additive or subtractive plating processes, e.g. electroless or electrolytic plating in combination with suitable etching processes. In an exemplary method, a photo-sensitive layer is disposed on the conductive carrier and patterned to create openings corresponding to the locations of the anchoring and/or electrical elements to be disposed on the conductive carrier. Using the conductive carrier as a conductive plane, the anchoring and/or electrical elements are electroplated in the openings. The photo-sensitive layer is subsequently removed from the conductive carrier.

The electrical elements (e.g. 1610) are preferably formed simultaneously with the anchoring elements 1606a/1606b. Each of the electrical elements (e.g. 1610) may comprise a wiring trace (e.g. 1611) and/or a vertical pillar (e.g. 1608). The anchoring elements 1606a/1606b may have the same structure as the electrical elements (e.g. 1610) and surround the electrical elements (e.g. 1610) on the conductive carrier 1604.

Alternatively, the anchoring elements 1606a/1606b and electrical elements (e.g. 1610) may be formed sequentially by repeating the steps of photolithography and plating. This way, different heights and structures between the anchoring elements 1606a/1606b and the electrical elements (e.g. 1610) may be achieved.

The anchoring elements 1606a/1606b and the electrical elements (e.g. 1610) may be formed of conductive materials such as copper, nickel, gold, palladium, tin or combinations thereof. Preferably, the anchoring elements and the electrical elements are formed of the same materials.

Figure 16C:
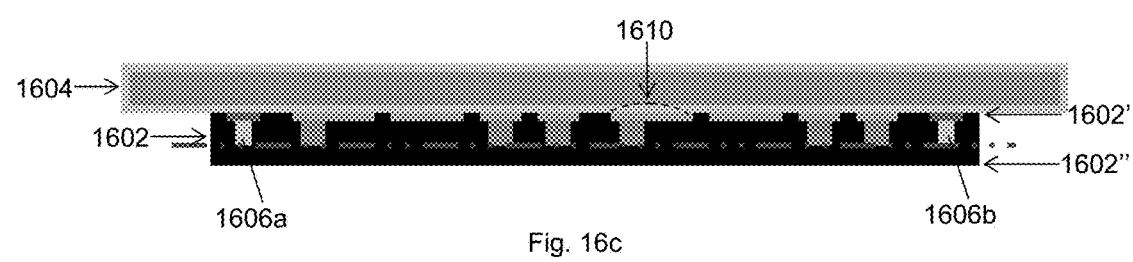

Thereafter, as shown in FIG. 16c, a layer element 1602 (e.g. an insulating layer element) is formed. The layer element 1602 comprises a first surface 1602' interfacing with the conductive carrier 1604 and a second surface 1602" opposite to the first surface 1602'. The layer element 1602 encapsulates the anchoring elements 1606a/1606b and the electrical elements (e.g. 1610) between the first 1602' and second surfaces 1602".

The layer element 1602 may be formed by molding, lamination, screen-printing or spin-coating. The layer element 1602 may comprise a molding compound or glass-reinforced epoxy laminate; a thermosetting polymer material such as epoxy resins, acrylic resins, polyimides, bismaleimide triazine; or a thermoplastic polymer material such as fluoropolymers, polyamides, polyethylene; and may further comprise inorganic fillers such as silica or ceramic.

In an embodiment, the layer element 1602 is preferably formed by molding (e.g. compression, injection, transfer). A mold tool (not shown) comprising a top chase and a bottom chase is provided. The top chase comprises a recessed portion that forms a cavity with the conductive carrier. The anchoring elements and the electrical elements are enclosed within the cavity. Preferably, the area of the cavity is smaller than and confined within the area of the conductive carrier such that the top chase is in contact with an overlapping portion of the conductive carrier. The bottom chase clamps the overlapping portion of the conductive carrier against the top chase to seal the cavity.

The mold tool may comprise a plurality of runners and gates connected to the sealed cavity to allow a fluid molding compound to be injected into the cavity. The molding compound may be pre-heated to a molten state prior to infusing into the sealed cavity at high pressure to completely pack the cavity. The molten molding compound encapsulates the anchoring elements and the electrical elements. Subsequently the molding compound is allowed to cure and solidify to form a dielectric layer. The assembly comprising the conductive carrier with the dielectric layer is removed from the mold tool, as shown in FIG. 16c. Post heat treatment may be needed to fully cure the dielectric layer.

Figure 16D:
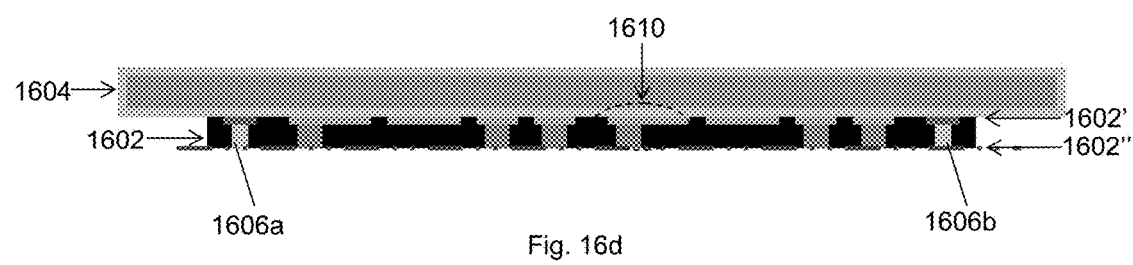

The height of the cavity may be greater than that of the anchoring elements and the electrical elements such the dielectric layer that is formed completely encapsulates the anchoring elements 1606a/1606b and the electrical elements (e.g. 1610), as shown in FIG. 16c. Thereafter, as shown in FIG. 16d, part of the dielectric layer is removed by grinding, polishing, buffing or etching to expose the base of the electrical elements (e.g. 1610). In this way, the electrical elements (e.g. 1610) connect the first surface 1602' to the second surface 1602" and a layer element 1602 is formed. Preferably, the base of the anchoring elements 1606a/1606b are also exposed on the second surface 1602". The layer element 1602, the anchoring elements 1606a/1606b and the electrical elements (e.g. 1610) may be further thinned down altogether to achieve the required thickness and evenness.

The cavity defines the dimension and position of the layer element on the conductive carrier. The area of the layer element 1602 is preferably equal to or smaller, and confined within the area of the conductive carrier 1604. The edge of the conductive carrier 1604 lies on or outside the boundary of the layer element 1602.

In an alternative embodiment, the top chase may comprise a plurality of recessed portions that form a plurality of cavities with the conductive carrier. Consequently, the dielectric layer that is formed is segmented into numerous blocks separated by a dividing gap and held together by the conductive carrier (as may be seen in FIG. 14, 15a, 15b). The number of dielectric layer blocks is equal to the number of cavities. Each dielectric layer block preferably has its corresponding anchoring elements disposed along its periphery.

Typically, after the step of encapsulating the electrical and anchoring elements, warpage of the assembly may occur due to mismatch in material properties between the conductive carrier and the dielectric layer. In order to achieve the flatness required during grinding, the assembly has to be clamped down flatly and tightly without contacting the dielectric layer.

In an embodiment, part of the dielectric layer is removed by grinding with the conductive carrier being magnetically held in place. An electromagnetic or a permanent magnet work plane (not shown) is provided. The conductive carrier, comprising a magnetic material such as steel, is disposed on the work plane and magnetically held in position. The magnetic force (field) may encompass an entire area of the conductive carrier such that the conductive carrier, including the areas below the dielectric layer, is magnetically attached to and in contact with the work plane. This helps to achieve the planarity of the layer element with minimal risk of damaging during grinding or other means of mechanical removal.

Alternatively, without using magnetic materials, the conductive carrier may be held in place by mechanically clamping the areas of the conductive carrier not covered by the dielectric layer to the work plane. These areas are preferably located along the periphery of the conductive carrier and outside the area of the dielectric layer.

With the conductive carrier held in place magnetically or mechanically, the grinding tool, in the form of a wheel, cylinder, barrel or disc, is brought into contact with the dielectric layer to begin the process of removal and exposing the electrical and anchoring elements.

In an alternative embodiment, a thin compressible polymeric sheet may be disposed on the top chase of the cavity. The height of the cavity is substantially equal to that of the anchoring and electrical elements such that the anchoring and electrical elements contact and compress into the polymeric sheet when they are enclosed in the cavity. The mold compound is subsequently infused into the cavity to encapsulate the anchoring and electrical elements. The finished assembly comprising the conductive carrier, the dielectric layer and the polymeric sheet is removed from the mold tool after the mold compound cures and solidifies. The polymeric sheet is removed to form the layer element which exposes the base of the electrical elements and anchoring elements.

The above steps of forming the electrical elements, the anchoring elements and the dielectric layer may be repeated to form a plurality of layer elements stacked on one another for higher density applications. The electrical elements in one layer element are connected to the electrical elements in the adjacent layers. Similarly, the anchoring elements in one layer are connected to the anchoring elements in the adjacent layers.

Figure 16E:
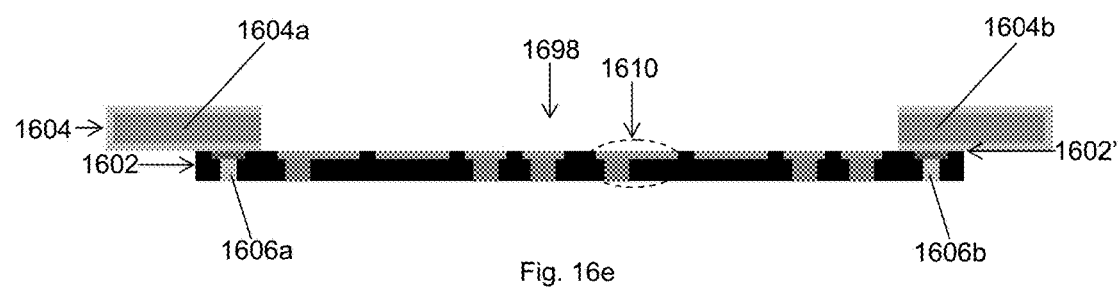

Next, one or more supporting elements 1604a/1604b (as shown in FIG. 16e) may be formed by selectively removing portion(s) of the conductive carrier 1604. The position of the supporting elements 1604a/1604b is substantially aligned with that of the anchoring elements 1606a/1606b (formed in an earlier step) such that the anchoring elements 1606a/1606b are connected to and anchor the supporting elements 1604a/1604b to the layer element 1602. Consequently, after selectively removing the conductive carrier 1604, the electrical elements (e.g. 1610) and a portion of the first surface of the layer element 1602 are exposed. Preferably, the top of the electrical elements are embedded within the first surface 1602' of the layer element.

In a preferred embodiment, one or more portions of the conductive carrier 1604 which overlie the layer element 1602 are removed to form one or more first openings 1698 exposing the electrical elements (e.g. 1610) and a portion of the first surface 1602' of the layer element. The remaining part of the conductive carrier is preferably connected and forms a continuous carrier ring extending along the periphery of the layer element. In an embodiment, when two or more first openings are formed, a truss element is formed from the remaining part of the conductive carrier which connects two opposite points of the carrier ring. The truss element can be considered as an extension of the supporting elements. An example of a truss element is shown as reference numeral 1599 in FIG. 15a.

The carrier ring is preferably formed by selectively etching away the conductive carrier using chemical methods. A portion of the carrier ring overlies the layer element 1602 and the anchoring elements 1606a/1606b. The portion of the carrier ring is connected to the anchoring elements 1606a/1606b along the periphery of the layer element 1602. In this way, the carrier ring acts as a single continuous supporting element and is coupled to the layer element 1602 with the anchoring elements 1606a/1606b to strengthen the layer element 1602.

In a preferred embodiment, the area of the layer element 1602 is smaller than that of the conductive carrier 1604. Thus, part of the conductive layer lies outside the area of the layer element. For example, see FIG. 16e. Consequently, after removing portion(s) of the conductive carrier overlying the layer element 1602, a part of the carrier ring overhangs outside the periphery of the layer element 1602 to form an overhang portion.

Figure 16F:
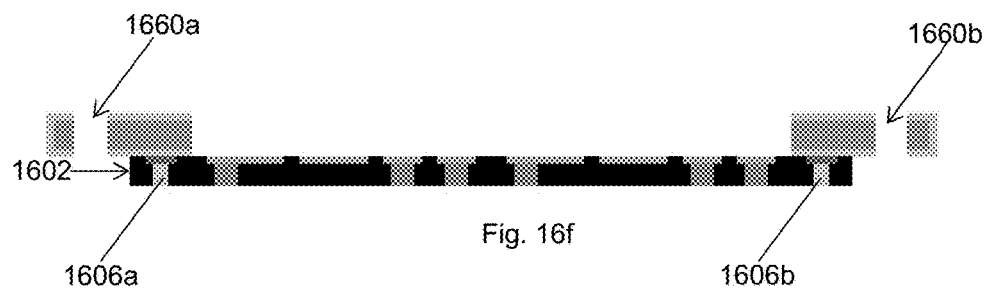

As shown in FIG. 16f, a plurality of second openings (e.g. 1660a/1660b) may be formed by removing a portion of the overhang portion of the carrier ring. Preferably, the first and second openings may be formed simultaneously. The plurality of second openings 1660a/1660b form through-holes and/or slots around the carrier ring.

A semiconductor structure comprising a layer element with supporting and anchoring elements is thus formed. The anchoring elements couple the supporting elements (i.e. the carrier ring) to the layer element to strengthen the layer element. As such, a thinner and larger layer element may be fabricated and handled with minimal risk of mechanical damage.

Figure 17A:
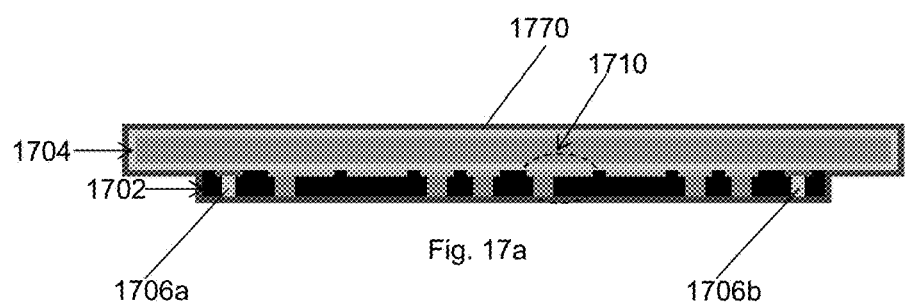
FIG. 17 a-e are cross-section diagrams illustrating the fabrication process of semiconductor structures, according to an embodiment of the invention.

In a further embodiment, prior to removing a portion of the conductive carrier to form the supporting elements (i.e. FIG. 16e), a cladding layer 1770 may be formed. Preferably, as shown in FIG. 17a, the cladding layer 1770 completely envelopes the conductive carrier 1704 and the layer element 1702, including the top surface and the sidewall of the conductive carrier 1704; the second surface and the sidewall of the layer element 1702; and the base surface of the electrical elements (e.g. 1710) and anchoring elements 1706a/1706b. The sidewall of the conductive carrier 1704 extends vertically between the top and bottom surface of the conductive carrier 1704. The sidewall of the layer element 1702 extends vertically between the first surface and the second surface of the layer element 1702. Preferably, if the area of the conductive carrier 1704 is larger than that of the layer element 1702, the cladding layer 1770 also covers a (exposed) bottom surface of the conductive carrier 1704.

Alternatively, the cladding layer 1770 may only cover the second surface of the layer element, the sidewall of the layer element and the (exposed) bottom surface of the conductive carrier that is adjacent to the layer element. Consequently, the cladding layer 1770 forms a conductive plane that connects to the base of the electrical elements and anchoring elements exposed on the second surface of the layer element.

Preferably, the cladding layer 1770 is formed by electroless or electrolytic plating. A thin conductive film may be disposed on the target surface to act as a seed layer for subsequent plating to thicken (build up) the cladding layer. Alternatively it may be formed by sputtering, spray coating or dip coating. The cladding layer preferably comprises a conductive material such as copper or nickel. Alternatively it may comprise a polymeric material.

Figure 17B:
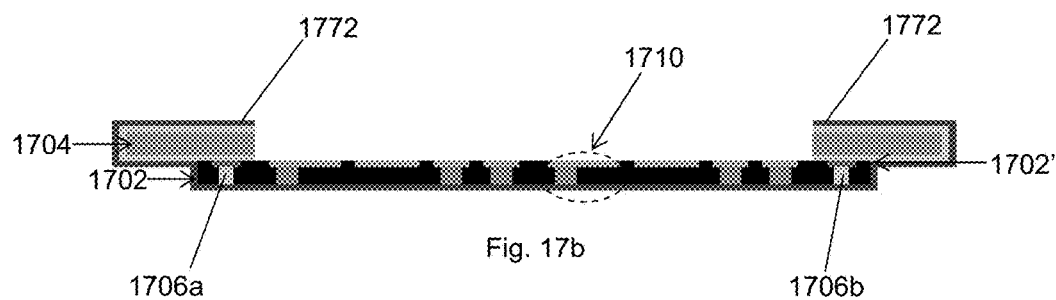

Thereafter, a portion of the conductive carrier 1704 and a portion of the cladding layer 1770 are removed to expose the electrical elements (e.g. 1710) on the first surface of the layer element 1702. The remaining portion of the conductive carrier 1704 forms the supporting element(s) and the remaining portion of the cladding layer 1770 forms a reinforcement element 1772, as shown in FIG. 17b. The reinforcement element 1772 covers the second surface of the layer element 1702, the (exposed) base of the electrical elements (e.g. 1710) and anchoring elements 1706a/1706b, the sidewall of the layer element 1702 extending vertically between the second surface and the first surface, and portions of the supporting elements. In particular, if the supporting element is in the form of a carrier ring as described above, the reinforcement layer 1772 covers the top and (exposed) bottom surface of the carrier ring, the outer sidewall of the carrier ring extending vertically between the top and bottom surface of the carrier ring. The outer sidewall may either lie outside (i.e. overhangs) or is in-line with the edge of the layer element.

Preferably, if the electrical elements are isolated from one another, the reinforcement element may act as a conductive plane to electrically connect the electrical elements together and also to connect to the support elements. The conductive plane enables further disposition of material on the exposed electrical elements on the first surface and/or the support elements by electroplating using the conductive plane as a common electrical transfer path.

Figure 17C:
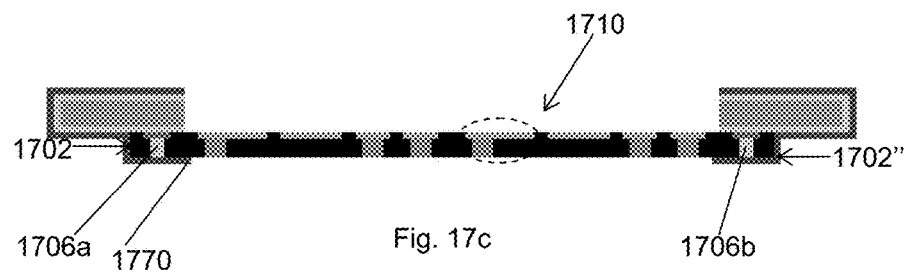

The base of the electrical elements (e.g. 1710) may be exposed (e.g. by chemical etching) by removing a portion of the reinforcement element 1772 on the second surface of the layer element 1702, as shown in FIG. 17c, such that the base of the electrical element and the second surface of the layer element 1702" may be exposed. The remaining portion of the reinforcement element 1772 covers the base of the anchoring elements 1706a/1706b and preferably forms a ring around the layer element 1702. This structure is substantially the same as the one shown in FIG. 12b above.

In another embodiment, as shown in FIG. 17d, in addition to the second surface of the layer element 1702" being partially exposed, the carrier ring 1704a/1704b may also be exposed (partially or wholly) by removing further portions of the reinforcement element 1772. This structure is substantially the same as the one shown in FIG. 12a above.

In another embodiment, as shown in FIG. 17e, the reinforcement element 1772 is formed only over the carrier ring 1704a/1704b by removing other portions of the reinforcement element 1772. In other words, the second surface of the layer element 1702" is fully exposed and a portion of the sidewall of the layer element 1702 that extends vertically between the first surface 1702' and the second surface 1702" of the layer element 1702 is partially exposed by removing selected portions of the reinforcement element 1770. This structure is substantially the same as the one shown in FIG. 12d above.

In yet another embodiment, prior to thinning the dielectric layer to expose the base of the electrical elements and the anchoring elements and form the layer element (similar to the method corresponding to FIG. 16d described above), the cladding layer may be formed only on the conductive carrier to strengthen the assembly and facilitate handing during the subsequent processes. The dielectric layer remains uncovered to facilitate the process of grinding. Thus after removing a portion of the dielectric layer to form the layer element and a portion of the conductive carrier to form the carrier ring, the structure as shown in FIG. 12d may be obtained.

Advantageously, with the formation of the cladding layer and/or the reinforcement elements (more than 10 μm), the inner core of the conductive carrier may be further protected and strengthened for processing and handling. The outer coating of the conductive layer may also be kept to a minimal requirement (less than 5 μm thickness). This facilitates the ease of removing the conductive carrier to expose the plurality of electric elements and form the supporting elements. In addition, it also improves the yield of semiconductor structures having electrical elements with fine features exposed on the surface of the layer element.

FIG. 18 is a flow chart 1800 illustrating the steps of a method of fabricating a semiconductor structure, according to an embodiment of the invention. At step 1802, one or more anchoring elements are formed over a carrier. At step 1804, the one or more anchoring elements are encapsulated within a layer element. At step 1806, the carrier is selectively etched to form one or more supporting elements.

It will be appreciated by a person skilled in the art that numerous variations and/or modifications may be made to the present invention as shown in the embodiments without departing from a spirit or scope of the invention as broadly described. For example, the anchoring elements may be formed or disposed along the sidewalls of the layer element to couple or clamp the supporting elements to the layer element. The anchoring elements may be partially exposed on the sides of the dielectric body of the layer element. This is still within the scope of the invention. The embodiments are, therefore, to be considered in all respects to be illustrative and not restrictive.

The invention claimed is:

1. A semiconductor structure, comprising:
    A discontinuous layer element comprising two or more discrete sections;
    one or more supporting elements disposed on a first surface of the layer element wherein one supporting element is disposed across each gap between adjacent discrete sections of the layer element; and
    two or more anchoring elements disposed within the layer element and connected to the one or more supporting elements to couple the one or more supporting elements to the layer element to strengthen the layer element,
    wherein each of the two or more anchoring elements comprises an upper section and a lower section,
    wherein, relative to the lower section, the upper section has a larger cross-sectional area in a plane parallel to the first surface of the layer element, the upper section being connected to the one or more supporting elements.

2. The semiconductor structure as claimed in claim 1, wherein a portion of at least one of the two or more anchoring elements is exposed on a second surface of the layer element, the second surface being opposite the first surface.

3. The semiconductor structure as claimed in claim 2, further comprising one or more reinforcement elements disposed on at least a portion of the second surface of the layer element, wherein the two or more anchoring elements are connected to the one or more reinforcement elements to couple the one or more reinforcement elements to the layer element to further strengthen the layer element.

4. The semiconductor structure as claimed in claim 1, further comprising one or more reinforcement elements disposed on at least a portion of the one or more supporting elements to further strengthen the layer element.

5. The semiconductor structure as claimed in claim 1, wherein the one or more supporting elements comprise a magnetic material.

6. The semiconductor structure as claimed in claim 5, wherein the one or more supporting elements further comprise a coating, the coating being disposed over at least a portion of the magnetic material.

7. The semiconductor structure as claimed in claim 1, wherein the one or more supporting elements are disposed at an edge portion of the layer element.

8. The semiconductor structure as claimed claim 7, wherein a portion of the one or more supporting elements extend beyond the edge of the layer element to define an overhang portion.

9. The semiconductor structure as claimed in claim 8, wherein the overhang portion comprises one or more through-holes.

10. The semiconductor structure as claimed in claim 1, wherein the layer element comprises an insulating substrate layer element having one or more electrical elements.

11. The semiconductor structure as claimed in claim 1, comprising one supporting element, wherein the one supporting element extends around a perimeter of the layer element.

12. The semiconductor structure as claimed in claim 1, wherein at least one of the two or more anchoring elements is a pillar or column.

13. The semiconductor structure as claimed in claim 1, further comprising:
    a further layer element; and
    one or more further anchoring elements disposed within the further layer element and connected to the two or more anchoring elements of the layer element to strengthen both the layer element and the further layer element.

14. A method of fabricating a semiconductor structure, the method comprising:

forming two or more anchoring elements over a carrier such that each of the two or more anchoring elements comprises an upper section and a lower section, and such that, relative to the lower section, the upper section has a larger cross-sectional area in a plane parallel to the first surface of the layer element;

encapsulating the two or more anchoring elements within a discontinuous layer element comprising two or more discrete sections; and selectively etching the carrier to form one or more supporting elements such that the one or more supporting elements are connected to the upper section of the respective two or more anchoring elements and one supporting element is disposed across each gap between adjacent discrete sections of the layer element.

15. The method as claimed in claim 14, further comprising forming one or more electrical elements over the carrier.

16. The method as claimed in claim 14, further comprising forming one or more through-holes in the one or more supporting elements.

17. The method as claimed in claim 14, further comprising planarizing the layer element to expose at least a portion of at least one of the two or more anchoring elements.

18. The method as claimed in claim 17, further comprising forming one or more reinforcement elements over at least a portion of the two or more exposed anchoring elements.

19. The method as claimed in claim 14, further comprising forming one or more reinforcement elements over at least a portion of the one or more supporting elements.

20. The method as claimed in claim 14, further comprising forming a coating over at least a portion of an inner magnetic core; the inner magnetic core and coating defining the carrier.

21. The method as claimed in claim 14, further comprising forming one or more dividing gaps in the layer element.

22. The method as claimed in claim 17, wherein planarizing the layer element comprises magnetically securing the carrier to a work plane.

23. The method as claimed in claim 22, wherein magnetically securing the carrier to a work plane comprises disposing the carrier comprising a magnetic material on the work plane comprising an electromagnet permanent magnet.

* * * * *